(12) United States Patent
Ju

(10) Patent No.: US 6,857,184 B2
(45) Date of Patent: Feb. 22, 2005

(54) CONNECTING METHOD OF PINS AND TIN BALLS OF AN ELECTRIC CONNECTOR

(76) Inventor: Ted Ju, No. 15, Wu Shiunn St., An Leh District, Keelung City (TW)

(*) Notice: Subject to any disclaimer, the term of this patent is extended or adjusted under 35 U.S.C. 154(b) by 202 days.

(21) Appl. No.: 10/255,665

(22) Filed: Sep. 27, 2002

(65) Prior Publication Data

US 2004/0063341 A1 Apr. 1, 2004

(51) Int. Cl.⁷ .............................................. H01R 43/20
(52) U.S. Cl. ............................. 29/876; 29/877; 29/878; 29/881; 29/882; 439/66; 439/83; 439/876
(58) Field of Search ...................... 29/876, 877, 878, 29/881, 882; 439/66, 83, 876

(56) References Cited

U.S. PATENT DOCUMENTS

| | | | | |
|---|---|---|---|---|
| 6,056,558 A | * | 5/2000 | Lin et al. | 439/83 |
| 6,217,348 B1 | * | 4/2001 | Lin et al. | 439/83 |
| 6,572,397 B2 | * | 6/2003 | Ju | 439/342 |

* cited by examiner

Primary Examiner—Carl J. Arbes
Assistant Examiner—Tim Phan
(74) Attorney, Agent, or Firm—Bacon & Thomas PLLC

(57) ABSTRACT

A connecting method for pins and tin balls of an electric connector. Pins of the electric connector elastically resist against tin balls so as to position the pins. The lower ends of the pins store elastic energy due to the elastically resisting contact. During welding by blowing heated air, the elastic energy is released to push the melting tin balls so that the lower ends of the pins of the electric connector is tightly combined with the PC board.

3 Claims, 8 Drawing Sheets

CONNECTING METHOD OF PINS AND TIN BALLS OF AN ELECTRIC CONNECTOR

BACKGROUND OF THE INVENTION (a) Field of the Invention

The present invention relates to electric connectors, and particularly to a connecting method of pins and tin balls of an electric connector, wherein a plurality of pins of the electric connector resist against tin balls so as to position the pins; the lower ends of the pins store elastic energy due to the resisting contact. Thereby, the lower end of the pin is well conductive to a PC board and the yield.

(b) Description of the Prior Art

Referring to FIGS. 16 to 18, the prior art connecting way of pins of electric connector and tin balls are illustrated. A layer of weld-assisting agent is coated at a lower end 101 of the pin 10 of an electric connector so as to combine the tin ball 30 to the lower end 101 of the pin 10. Then, the PC board 40 is welded with the electric connector by blowing heated air and thus the tin ball 30 is melted and welded to a lower end of the pin 101 and the joint 401 of the PC board. With reference to FIG. 18, the dashed line shows a preferred connection. Substantially, the prior art welding operation will generate a siphon effect due to the blowing operation. Thereby, after the tin ball 30 is melted, the tin liquid will be absorbed upwards so that most of the tin liquid is condensed to the lower end 101 of the pin. Only a small amount tin liquid is adhered to the joint 401 of the PC board. Thus the connection is not preferred and dull welding occurs (see the solid line in FIG. 18, where the melted tin ball is not in contact condition). Thus, the lower end 101 of the pin is not preferably conductive to the joint 401 of the PC board. As a result, the function of the electric connector is not preferred and the yield ratio is low.

SUMMARY OF THE INVENTION

Accordingly, the primary object of the present invention is to provide a connecting method of pins and tin balls of an electric connector, wherein pins of the electric connector resist against tin balls so as to position the pins; the lower ends of the pins store elastic energy due to the elastic resisting of the pins against the resisting contact. During welding by blowing, heated air, the elastic energy is released to push the melting tin balls so that the lower ends of the pins of the electric connector is tightly combined with the PC board. Thereby, the lower end of the pin is highly conductive to the PC board 2 and the yield ratio is improved.

DETAILED DESCRIPTION OF THE PREFERRED EMBODIMENTS

Figure 1:
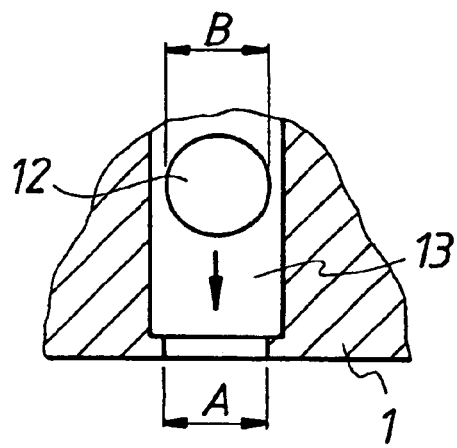
FIGS. 1 to 3 show the first embodiment of the present invention, where according to the present invention, the tin ball is placed in the receiving hole of the electric connector and elastically resists at a lower end as that the lower end deforms.

The connecting method of pins and balls of an electric connector of the present invention will be described in the following with the appended drawings.

In the present invention, before welding an electric connector 1 and a PC board 2 by blowing heated air, a lower end 111 of each of a plurality of pins 11 is elastically resisted against a tin ball 12 so as to be positioned thereon. The lower end 111 of each pin 11 has elastic energy. Thereby, during welding, by releasing this energy, the melting tin ball 12 can be pushed downwards. Thereby, the lower end 111 is actually combined to the PC board 2.

Figure 2:
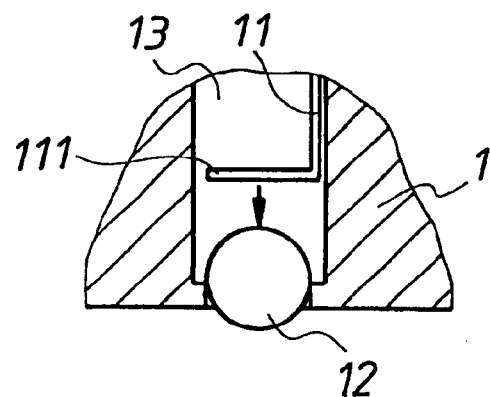
Figure 3:
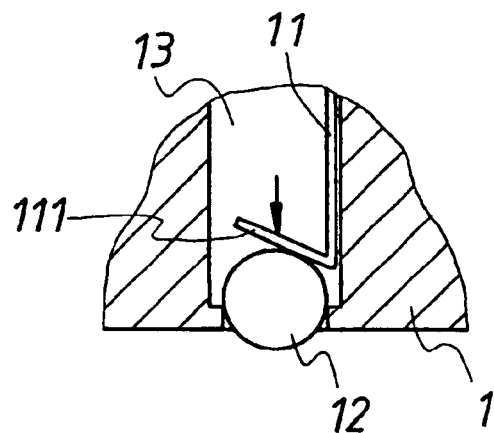

Referring to FIGS. 1 to 3, a first embodiment of the present invention about the connecting method of pins and balls of an electric connector of the present invention is illustrated. Before welding the electric connector 1 and the PC board 2 by blowing heated air, the tin balls 12 are preinstalled in a plurality of receiving holes 13 one by one. A distal end of each receiving hole 13 has a diameter A smaller than the diameter B of the tin ball 12 so that after the tin ball 12 has been placed in the receiving hole 13, it is buckled therein (referring to FIG. 2) and part of the tin ball 12 exposes out of the receiving hole 13. Then the pins 11 of the electric connector 1 are placed therein one by one so that the lower end 111 of the pin 11 resists against the tin ball 12 and is positioned thereagainst. A lower end 111 of the pin 11 resists against the tin ball 12 and thus it is bent and deformed so as to store elastic energy (referring to FIG. 3).

Figure 4:
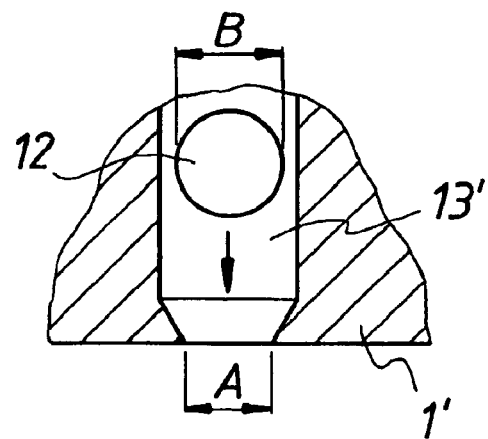
FIGS. 4 to 6 show the second embodiment of the present invention, where according to the present invention, the tin ball is placed in a receiving hole of a tapered pin of the electric connector and elastically resists at a lower end thereof.
Figure 5:
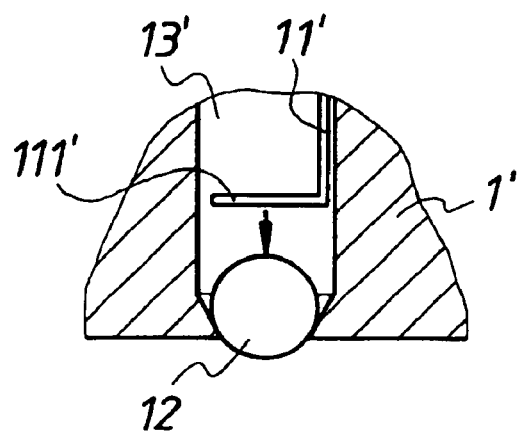
Figure 6:
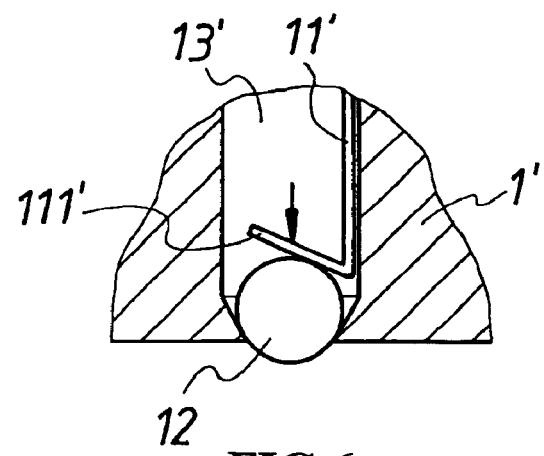

Likewise, referring to FIGS. 4 to 6, the second embodiment of the present invention is illustrated. In about electric connector 1', each of the plurality of receiving holes 13' has distal end with a hole diameter A'. The hole at the distal end is a tapered hole. Thereby, the diameter A' must smaller than the diameter B' of the tin ball 12 so that when the tin ball 12 is placed in the receiving hole 13', it can be buckled therein (referring to FIG. 5). The receiving hole 13' has a part being exposed. Then the pins 11' of the electric connector 1 is embedded one by one so that the lower ends 111' of the pins 11' resists against the tin ball 12 and are positioned therein. Since the lower ends 111' of the pins 11' resists against tin balls 12 and thus they are deformed and thus elastic energy is stored (referring to FIG. 6).

Figure 7:
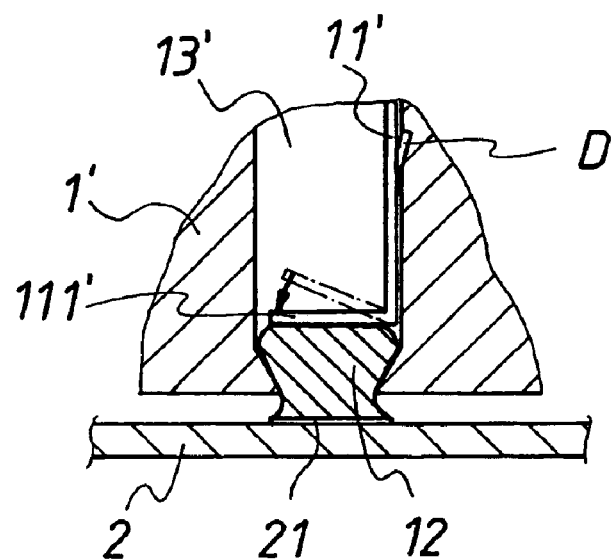
FIG. 7 shows the second embodiment of the present invention, where the elastic energy at the lower end of the connector is released during welding by blowing heated air so that a melted tin ball is pushed downwards to be tightly connected to a PC board.

According to above first or second embodiment, each pin 11(11') resists against the tin ball 12 so as to store elastic energy. Thereby, in welding, the elastic energy stored in the pins will be released to push the melt tin ball 12 downwards. Thus, the lower ends 111 (111') of the electric connector 1 are tightly engaged to the joints 21 of the PC board 2 (referring to FIG. 7). Thus, no dull welding occurs. A preferred effect is obtained and the conductivity is acquired.

Figure 8:
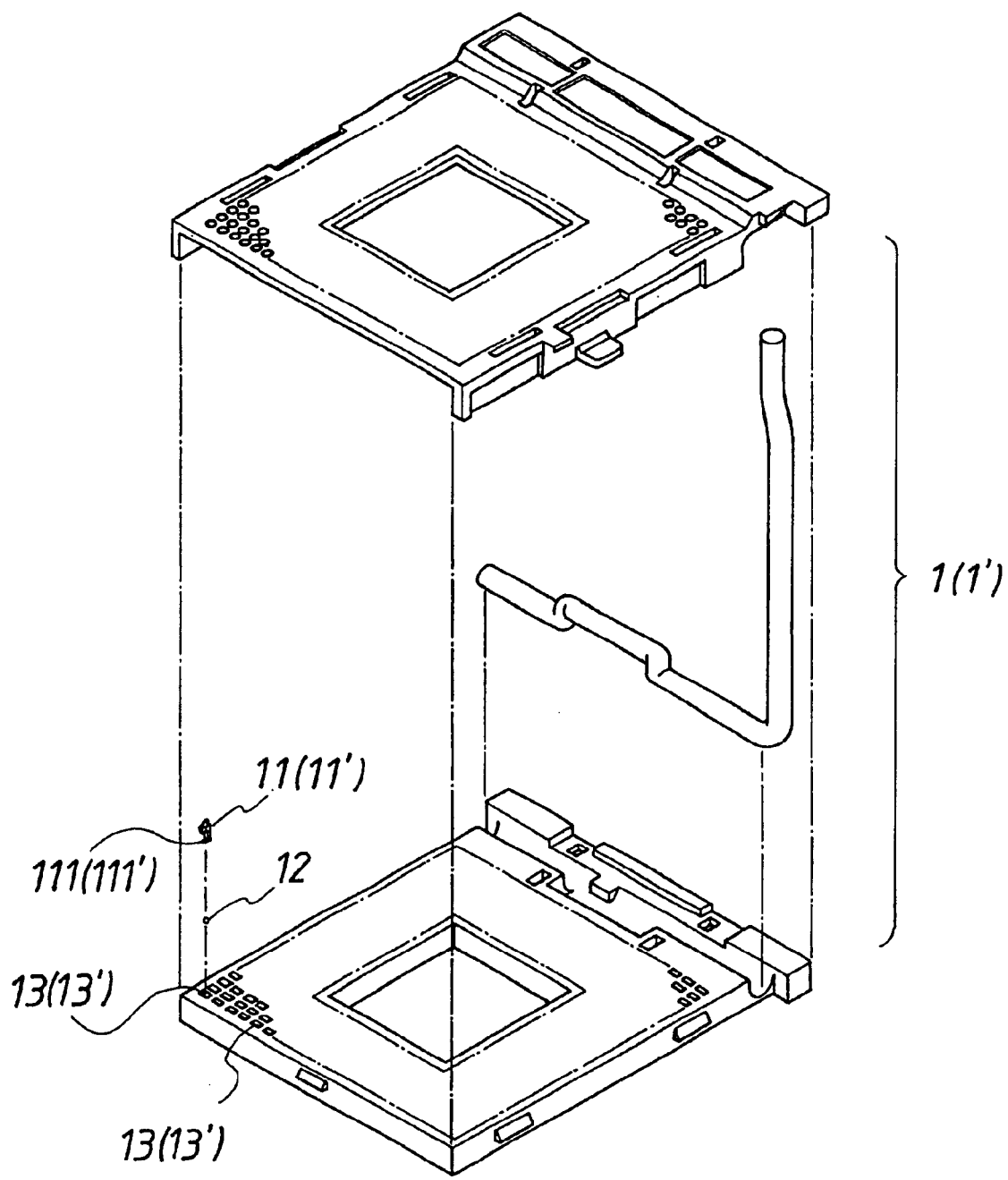
FIG. 8 is an exploded perspective view of electric connectors which are arranged as an array.
Figure 9:
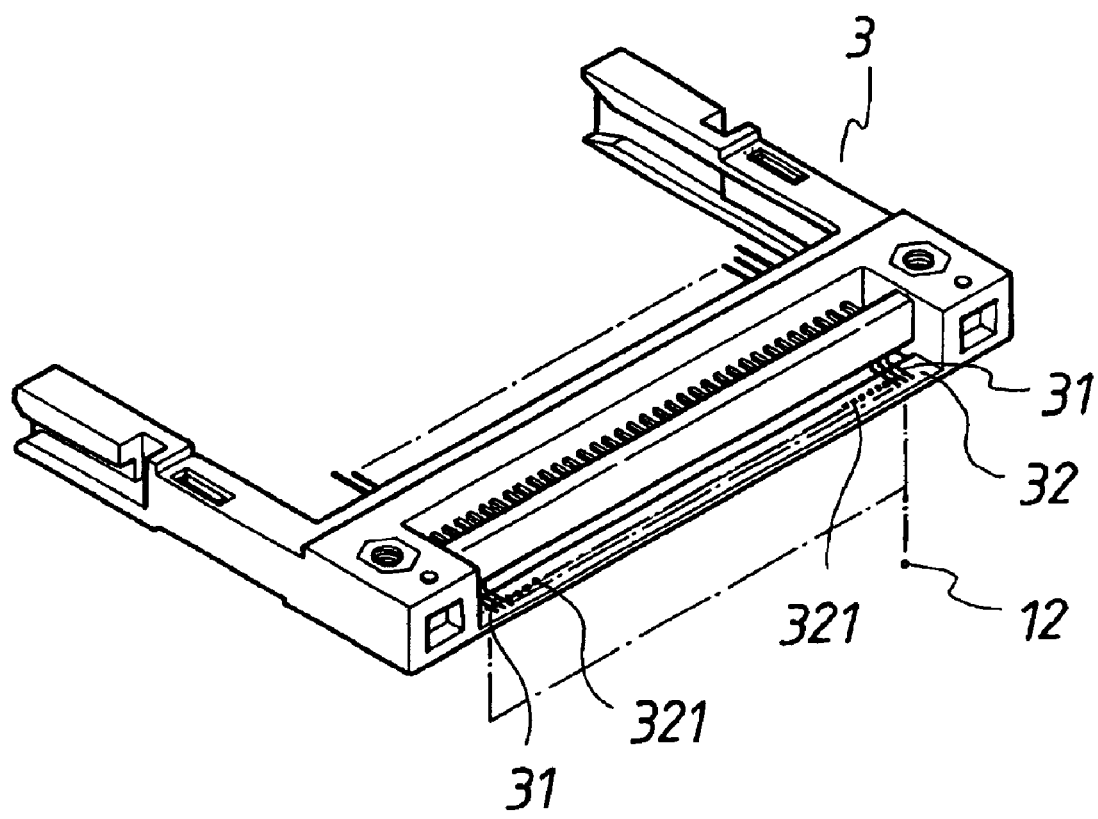
FIG. 9 is an assembled schematic view of the third embodiment of the present invention.
Figure 10:
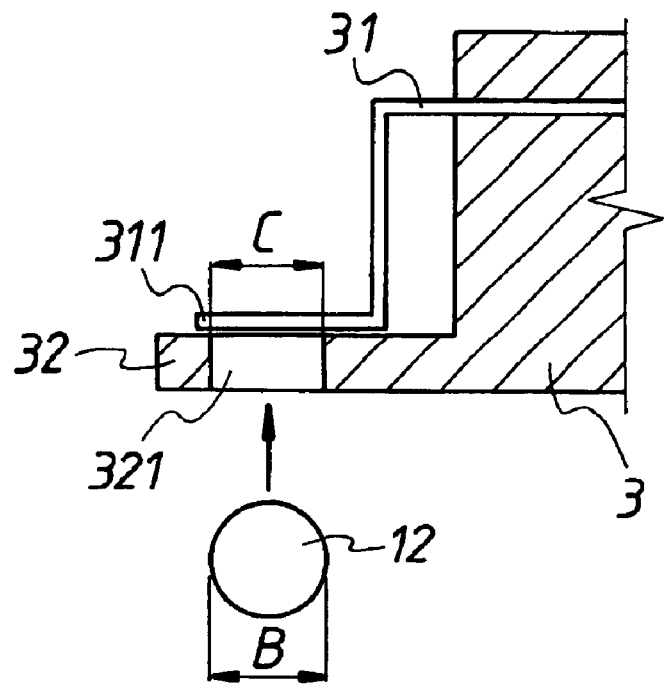
FIG. 10 is a partial cross sectional view of the third embodiment of the present invention, wherein the tin ball is not in a buckled condition.
Figure 11:
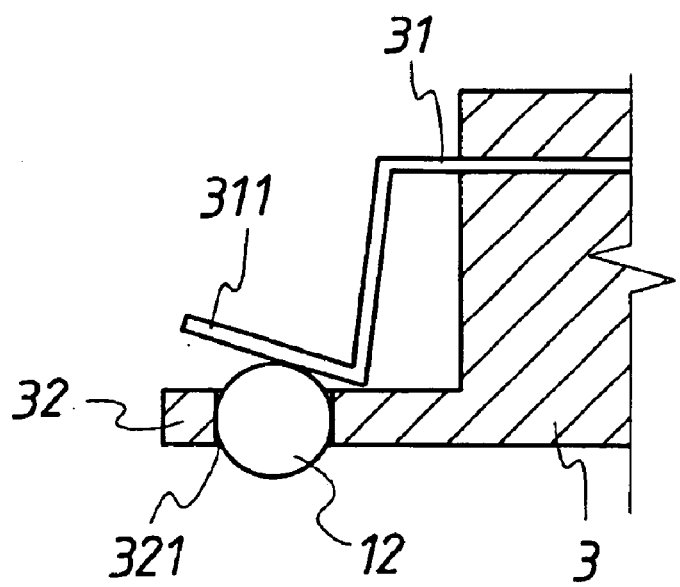
FIG. 11 is a partial cross sectional view of the third embodiment of the present invention, which illustrates the pin in a buckled condition.

In above embodiment, as illustrated in FIG. 8, the electric connector 1 is arranged as an array. For another example illustrated in FIG. 9, the electric connector 1 has a plurality of pins 31 which is embedded therein and parts of the pins are exposed. Thereby, in the third embodiment of the present invention, the electric connector 1 has a transversal unit 32 at position below the plurality of pins 31. The transversal unit 32 is formed with a plurality of tin ball implanting holes (referring to FIGS. 10 and 11) with respect to the pins 31. A distal end of each tin ball planting hole 321 has a hole diameter C slightly smaller than the diameter B of the tin ball 12. Thereby, the tin ball 12 can be placed into the tin ball planting hole 321 to be tightly engaged therein and part of the tin ball 12 is exposed from the tin ball receiving hole 321 so that the lower end 111 of each pin 31 of the electric connector 1 exactly resists against the tin ball 12 and is positioned thereupon. Because of the elastic resistance and contact, the lower end 311 of the pin is bent and deformed so that elastic energy is stored therein.

Figure 12:
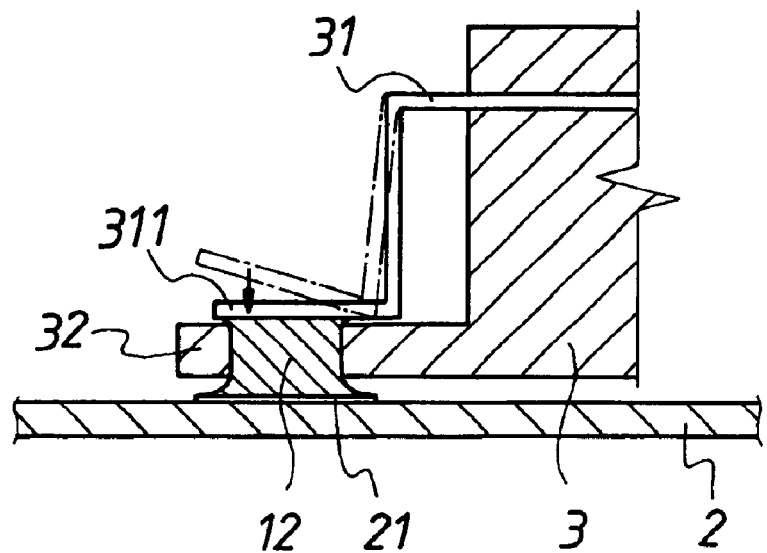
FIG. 12 shows the operation of the third embodiment, wherein after welding by blowing heated air, the elastic energy of the pin is released so that melted tin ball is pushed downwards to be tightly combined to a PC board.

As disclosed in the third embodiment of the present invention, since the pins 31 elastically resists against the tin ball 12, in welding by blowing, the elastic energy stored in the pin 31 will be released so that the melted tin ball 12 will be pushed downwards to assure that the lower ends 311 of the electric connector 1 are tightly combined with the joints 21 of the PC board 2 (referring to FIG. 12).

Figure 13:
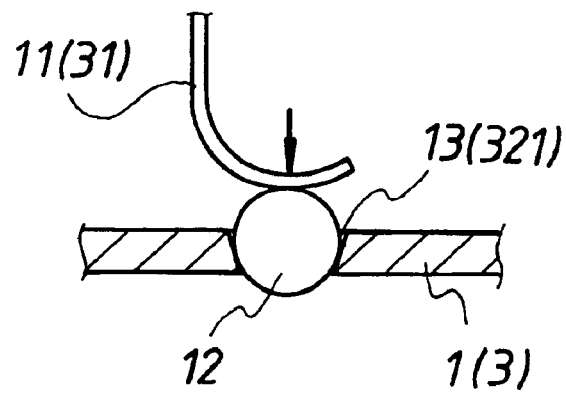
FIGS. 13 to 15 are schematic view showing the various kinds of pins of the present invention which are used with tin balls.
Figure 14:
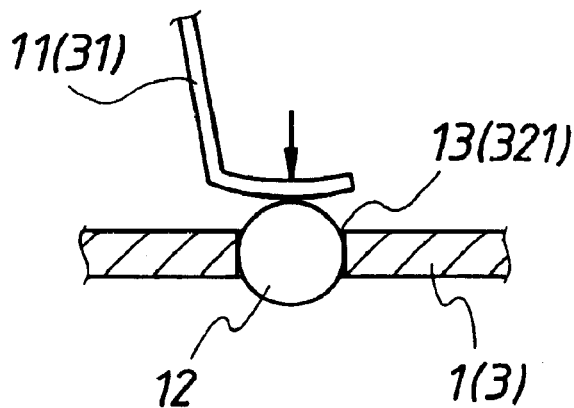
Figure 15:
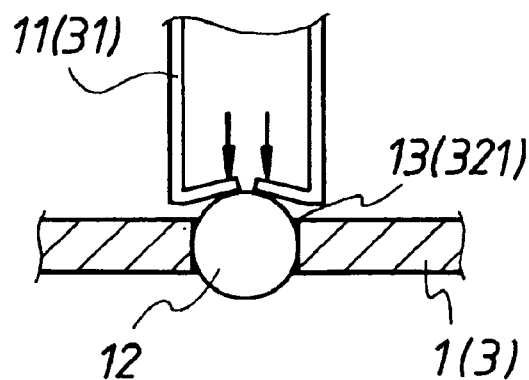
Figure 16:
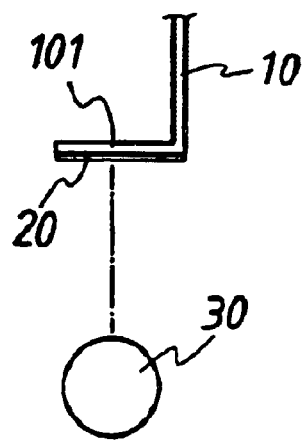
FIGS. 16 to 18 show the operation of prior art, where the pins of electric connector and tin balls are assembled through welding-assisted material.
Figure 17:
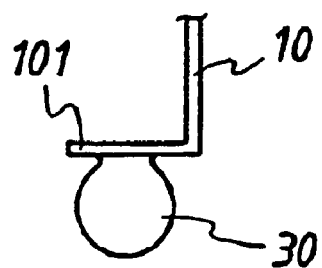
Figure 18:
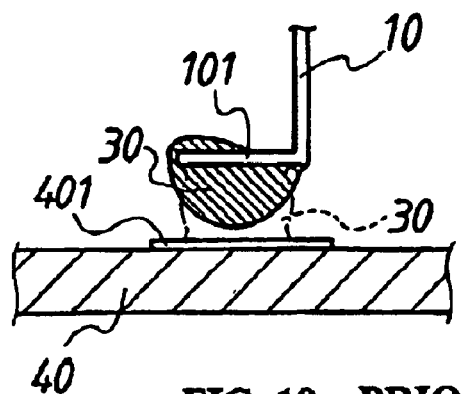

In above embodiment, the plurality of pins 11, 11' or 31 of the electric connector 1, 1' or 3, respectively, are not confined. Other than the above flat bending type, the lower end 111, 111' or 311 may be of any desired arc shape (referring to FIG. 13 or 14). The lower end of each pin has a configuration having two concave portions (referring to FIG. 15). However, any arrangement which causes the lower ends of the pins 11, 11' or 31 to elastically resist against the tin ball 12 is suitable in the present invention.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A connecting method for pins and tin balls of an electric connector, comprising the steps of:

providing a plurality of the pins of the electric connector that elastically resist against the tin balls, with lower ends of the pins storing elastic energy due to the elastic contact between the respective pins and the tin balls;

welding by blowing heated air so that the elastic energy of the pins is released, thereby pushing melting ones of the tin balls such that the lower ends of the pins of the electric connector is pushed against the PC board;

preinstalling the tin balls in a plurality of receiving holes one by one, wherein a distal end of each of the receiving holes has a diameter smaller than that of the respective ones of tin balls so that after the respective one of the tin balls has been placed in the respective one of the receiving holes, a shape of the respective ones of the tin balls buckles due to the welding in the respective ones of the receiving holes and part of the respective ones of the tin balls is exposed out of the respective ones of the receiving holes; and placing the pins of the electric connector over the tin balls one by one so that the lower ends of the pins elastically resist against and contact respective ones of the tin balls.

2. The connecting method of pins and tin balls of an electric connector as claimed in claim 1, wherein each of the receiving holes has a distal end having a tapered hole, diameter of the tapered holes are smaller than that of the tin balls.

3. The connecting method of pins and tin balls of an electric connector as claimed in claim 1, wherein the pins of the electric connector each have a buckling portion which is buckled against respective ones of the receiving holes.

* * * * *